United States Patent
Wu

(10) Patent No.: US 7,382,038 B2
(45) Date of Patent: Jun. 3, 2008

(54) SEMICONDUCTOR WAFER AND METHOD FOR MAKING THE SAME

(75) Inventor: Ping-Chang Wu, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/277,149

(22) Filed: Mar. 22, 2006

(65) Prior Publication Data

US 2007/0222037 A1    Sep. 27, 2007

(51) Int. Cl.
   *H01L 23/544* (2006.01)

(52) U.S. Cl. ............................. 257/620; 257/E23.179

(58) Field of Classification Search ............... 257/620, 257/E23.179; 438/460, 462
   See application file for complete search history.

(56) References Cited

U.S. PATENT DOCUMENTS

| | | | |
|---|---|---|---|
| 6,022,791 A * | 2/2000 | Cook et al. | 438/458 |
| 6,365,958 B1 * | 4/2002 | Ibnabdeljalil et al. | 257/620 |
| 6,441,465 B2 * | 8/2002 | Lin et al. | 257/620 |
| 6,492,247 B1 * | 12/2002 | Guthrie et al. | 438/460 |
| 6,563,196 B2 | 5/2003 | Miyagawa | |
| 6,943,061 B1 | 9/2005 | Sirinorakul | |
| 7,078,805 B2 | 7/2006 | Makabe et al. | |
| 7,129,566 B2 * | 10/2006 | Uehling et al. | 257/620 |
| 7,223,673 B2 * | 5/2007 | Wang et al. | 438/460 |
| 7,224,060 B2 * | 5/2007 | Zhang et al. | 257/730 |
| 2003/0092252 A1 | 5/2003 | Nishiyama | |
| 2005/0282360 A1 | 12/2005 | Kida et al. | |
| 2006/0001144 A1 * | 1/2006 | Uehling et al. | 257/690 |
| 2006/0163699 A1 * | 7/2006 | Kumakawa et al. | 257/620 |
| 2006/0278957 A1 * | 12/2006 | Lin et al. | 257/620 |

FOREIGN PATENT DOCUMENTS

| | | |
|---|---|---|
| JP | 2006/041449 | 2/2006 |
| KR | 2002/0011098 | 2/2002 |
| KR | 2004/0034484 | 4/2004 |

OTHER PUBLICATIONS

Michael Quirk and Julian Serda, Semiconductor Manufacturing Technology, Prentice Hall, pp. 214-222.*

* cited by examiner

*Primary Examiner*—David A Zarneke
(74) *Attorney, Agent, or Firm*—Winston Hsu

(57) ABSTRACT

A semiconductor wafer includes a plurality of active circuit die areas, each of which being bordered by a dicing line through which the plurality of active circuit die areas are separated from each other by mechanical wafer dicing. WAT pads are disposed along the dicing line. Each of the WAT pads has thereon a slot opening. A reinforcement structure is formed within the slot opening and penetrates through the WAT pad for stopping propagation of de-lamination during wafer dicing.

7 Claims, 2 Drawing Sheets

SEMICONDUCTOR WAFER AND METHOD FOR MAKING THE SAME

BACKGROUND OF THE INVENTION

1. Field of the Invention

The present invention relates generally to semiconductor integrated circuit devices and, more particularly, to the fabrication of semiconductor integrated circuit chips provided with a means of stopping propagation of interface de-lamination between dielectric layers originated from the wafer dicing process.

2. Description of the Prior Art

Semiconductor manufacturers have been shrinking transistor size in integrated circuits (IC) to improve chip performance. This has resulted in increased speed and device density. For sub-micron technology, the RC delay becomes the dominant factor. To facilitate further improvements, semiconductor IC manufacturers have been forced to resort to new materials utilized to reduce the RC delay by either lowering the interconnect wire resistance, or by reducing the capacitance of the inter-layer dielectric (ILD). A significant improvement was achieved by replacing the aluminum (Al) interconnects with copper, which has ~30% lower resistivity than that of Al. Further advances are facilitated by the change of the low-k dielectric materials.

However, one shortcoming associated with the use of low-k dielectrics is that almost all low-k dielectric materials possess relatively lower mechanical strength than that of conventional silicon oxide dielectrics such as FSG or USG. The use of low-k dielectrics poses this industry another problem that the adhesion ability, either at the interface between two adjacent low-k dielectric layers or at the interface between a low-k dielectric layer and a dissimilar dielectric layer, is inadequate to meet the requirements in the subsequent wafer treatment processes such as wafer dicing, which is typically performed to mechanically cut a semiconductor wafer into a number of individual IC chips.

It has been found that the so-called "interface de-lamination" phenomenon occurs between low-k dielectric layers during or after the wafer dicing process is performed, causing performance degradation of the IC chips. In light of the above, a need exists in this industry to provide a solution to the undesired propagation of the interface de-lamination between low-k dielectric layers originated from the wafer dicing process.

SUMMARY OF THE INVENTION

It is therefore the primary object of the present invention to provide an effective reinforcing structure, which is disposed deliberately in and along two opposite sides of each WAT pad on a wafer in order to stop the propagation of interface de-lamination between low-k dielectric layers originated from the wafer dicing process.

According to the claimed invention, a semiconductor wafer is provided. The semiconductor wafer comprises a plurality of active circuit die areas, each of which being bordered by a dicing line through which the plurality of active circuit die areas are separated from each other by mechanical wafer dicing; a plurality of pads in the dicing line, wherein the pads comprises at least a test circuit in a plurality of dielectric layers; and a reinforcing structure comprising a plurality of vias in the dielectric layers disposed along at least one side of each said pad for stopping propagation of dielectric de-lamination originating from the mechanical wafer dicing.

From one aspect of this invention, a method for dicing a semiconductor wafer is provided. A plurality of active circuit die areas are formed on a semiconductor wafer, and each of the active circuit die areas is bordered by a dicing line. A plurality of pads are provided in the dicing line. A reinforcing structure is provided in the pads and along at least one side of each said pad. The semiconductor wafer is diced along the dicing line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
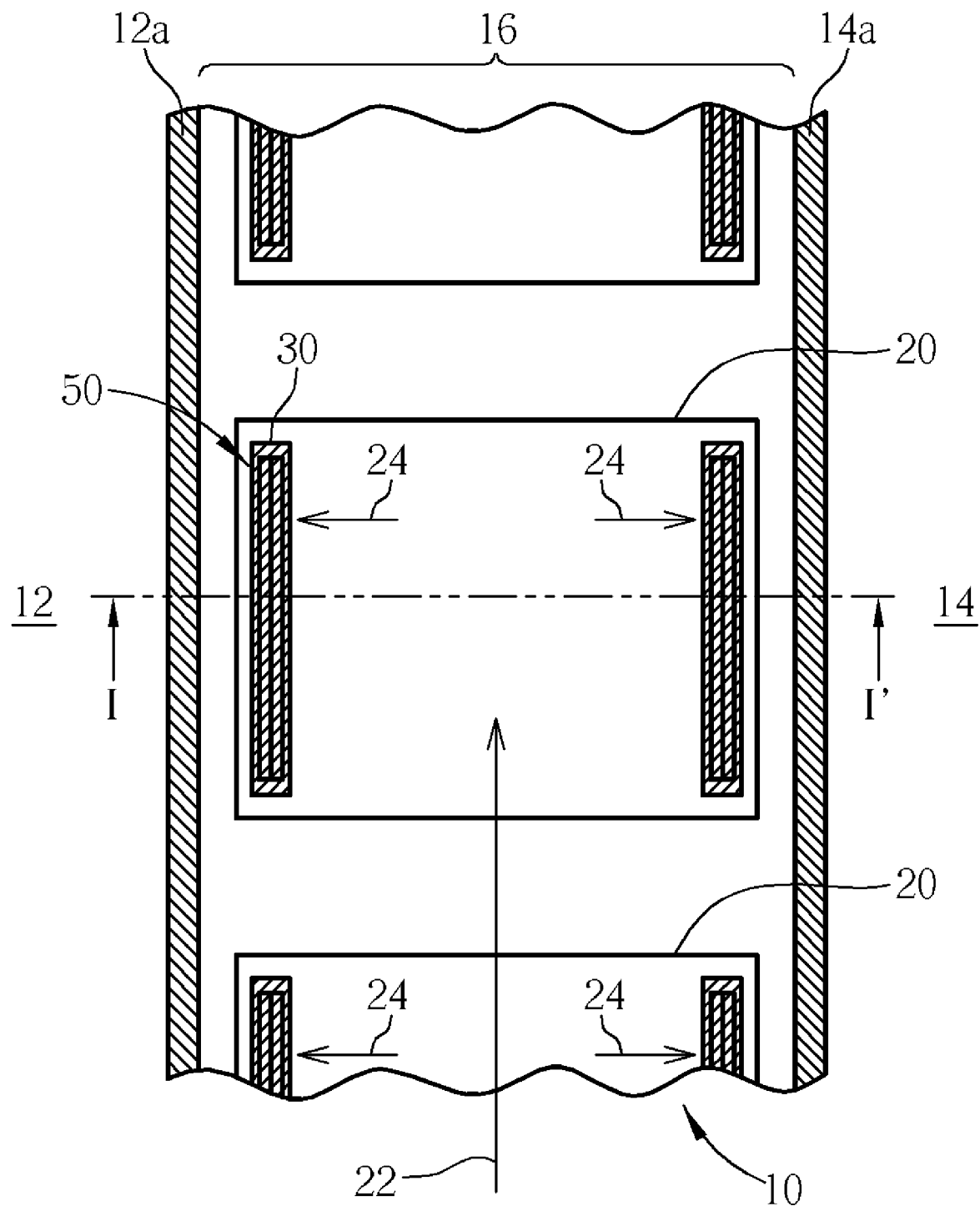
FIG. 1 is an enlarged, schematic plan view of the dicing line between circuit chips of a semiconductor wafer in accordance with one preferred embodiment of this invention.
Figure 2:
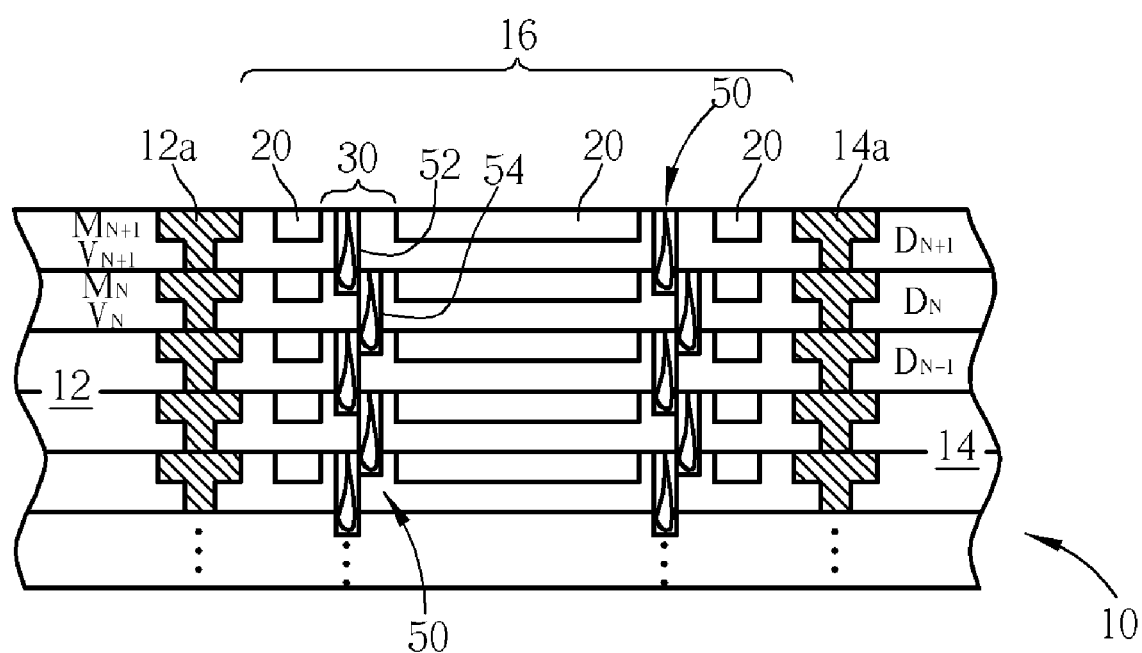
FIG. 2 is a schematic cross section taken along line I-I of FIG. 1.

Please refer to FIGS. 1 and 2. FIG. 1 is an enlarged, schematic plan view of the dicing line between circuit chips of a semiconductor wafer in accordance with one preferred embodiment of this invention. FIG. 2 is a schematic cross section taken along line I-I of FIG. 1. As shown in FIG. 1, a semiconductor wafer 10 comprises two adjacent integrated circuit chips 12 and 14.

There is a dicing line 16 between the two adjacent integrated circuit chips 12 and 14. A plurality of wafer acceptance testing (WAT) pads 20 is formed in the dicing line 16. The WAT pads 20 are connected with corresponding test key circuits (not shown). According to the preferred embodiment, the dimension of the WAT pad 20 is about 50 micrometers.

The integrated circuit chips 12 and 14 are surrounded by die seal rings 12a and 14a, respectively. Within the integrated circuit chips 12 and 14, an active integrated circuit is fabricated. The active integrated circuit may comprise components such as, for example, transistors, capacitors, diodes, diffusions, memory arrays and interconnections.

The die seal rings 12a and 14a consists of a plurality of patterned metal layers, positioned on top of each other and mutually connected by via or contact plugs. The die seal ring is common in this art and is utilized to protect the active integrated circuit from being damaged by cracks originating from the wafer dicing process. The die seal rings 12a and 14a are manufactured step by step as sequential depositions of insulators and metals in conjunction together with the fabrication of the integrated circuit elements.

Typically, a heavily doped region (not shown) is diffused into the semiconductor material such as a silicon substrate in a process needed otherwise for fabricating strongly doped surface regions as an anchor for the seal ring structure to be built, and permits the application of specific electrical potentials to the seal ring structure, such as ground potential or $V_{SS}$. Finally, a protective overcoat such as silicon nitride covering both the circuit chips and the dicing streets is deposited over the whole wafer.

In FIG. 1, the arrow 22 indicates the direction of wafer dicing, while the arrows 24 indicates the direction of stress induced by wafer dicing blade or the direction of propagation of dielectric de-lamination. As previously mentioned, interface de-lamination phenomenon occurs between low-k dielectric layers during or after the wafer dicing process is performed, causing performance degradation of the IC chips.

To prevent this damage caused by wafer dicing, as best seen in FIG. 1, two slots 30 are deliberately formed on two opposite sides of each WAT pad 20, which are substantially normal to the direction of arrow 24.

The length of each slot 30 is approximately equal to the length of the sides of each WAT pad 20. The width of each slot 30 is approximately 0.5 micrometer or smaller. The slots 30 are disposed in a direction that is in parallel with the wafer dicing direction as indicated by arrow 22. In each slot 30, a metal reinforcing structure 50 is provided.

As shown in FIG. 2, the metal reinforcing structure 50 comprises at least a first damascened metal blocking structure 52 and a second damascened metal blocking structure 54. Likewise, the metal reinforcing structure 50 is manufactured step by step as sequential depositions of insulators and metals in conjunction together with the fabrication of the integrated circuit elements. The damascened metal blocking structure may be in a row of vias or some via bars.

Still referring to FIG. 1, in the semiconductor wafer 10, the top metal wiring layer $M_{N+1}$ is electrically connected with the underlying metal wiring layer $M_N$ through the via layer $V_{N+1}$. The metal wiring layer $M_N$ is electrically connected with the underlying metal wiring layer through the via layer $V_N$.

The top metal wiring layer $M_{N+1}$ and the via layer $V_{N+1}$ are formed together in one metal deposition step by using a conventional damascene process. The top metal wiring layer $M_{N+1}$ and the via layer $V_{N+1}$ are formed in dielectric layer $D_{N+1}$, while the metal wiring layer $M_N$ and the via layer $V_N$ are formed in dielectric layer $D_N$.

The first damascened metal blocking structure 52 of the metal reinforcing structure 50 is fabricated in conjunction together with the top metal wiring layer $M_{N+1}$ and the via layer $V_{N+1}$, while the second damascened metal blocking structure 54 of the metal reinforcing structure 50 is fabricated in conjunction together with the metal wiring layer $M_N$ and the via layer $V_N$.

The method of forming the first damascened metal blocking structure 52 includes etching a high-aspect-ratio trench into the dielectric $D_{N+1}$ and slightly etching into the dielectric $D_N$, then depositing a metal layer into the trench.

According to the preferred embodiment, the first damascened metal blocking structure 52 and the second damascened metal blocking structure 54 partially overlaps with each other in a vertical direction. However, the first damascened metal blocking structure 52 and the second damascened metal blocking structure 54 may stack on each other in another case.

It is one salient feature of this invention that each of the damascened metal blocking structures of the metal reinforcing structure 50 has therein a void. Such hollow structure can be formed by control the aspect ratio of the trench. It is advantageous to use such hollow structure because the stress originating from the wafer dicing process can be released by the air gaps formed in the damascened metal blocking structures of the metal reinforcing structure 50, thereby ensuring the integrity of chips.

As best seen in FIG. 2, it is another salient feature of this invention that the bottom of the first damascened metal blocking structure 52 is lower then the top surface of the metal wiring layer $M_N$. The bottom of the first damascened metal blocking structure 52 is embedded into the dielectric $D_N$, while the bottom of the second damascened metal blocking structure 54 is embedded into the underlying dielectric $D_{N-1}$.

Furthermore, the shape of the slots 30 on the WAT pads 20 is not limited to rectangular shape shown in FIG. 1. According to another preferred embodiment of this invention, the shape of the slots 30 may be zigzag shaped, wavy, or consisting of a plurality of via holes. Other irregular shapes may be used.

A method for dicing a semiconductor wafer is provided. A plurality of active circuit die areas 12 and 14 are formed on a semiconductor wafer, and each of the active circuit die areas is bordered by a dicing line 16. A plurality of pads 20 are provided in the dicing line. A reinforcing structure 30 is provided in the pads 20 and along at least one side of each pad. The semiconductor wafer is diced along the dicing line 16 (direction 22).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor wafer, comprising:
    a plurality of active circuit die areas, each of which being bordered by a dicing line through which the plurality of active circuit die areas are separated from each other by mechanical wafer dicing;
    a plurality of wafer acceptance testing pads in the dicing line, said wafer acceptance testing pad comprising a plurality of dielectric layers; and
    a reinforcing structure disposed in said wafer acceptance testing pads, said reinforcing structure comprising a plurality of damascened metal blocking structures in the dielectric layers disposed along at least one side of each said wafer acceptance testing pad for stopping propagation of dielectric de-lamination originating from the mechanical wafer dicing, wherein the bottom of a first damascened metal blocking structure is embedded into an upper dielectric layer and the bottom of a second damascened metal blocking structure is embedded into an underlying dielectric layer of the upper dielectric layer.

2. The semiconductor wafer according to claim 1 wherein the plurality of damascened metal blocking structures comprise at least a row of vias.

3. The semiconductor wafer according to claim 1 wherein the plurality of damascened metal blocking structures comprise at least a via bar.

4. The semiconductor wafer according to claim 1 wherein the plurality of damascened metal blocking structures are filled with metal.

5. The semiconductor wafer according to claim 4 wherein the metal comprises copper.

6. The semiconductor wafer according to claim 1 wherein the plurality of damascened metal blocking structures have air gap therein.

7. The semiconductor wafer according to claim 1 wherein the reinforcing structure is disposed along two sides of each said wafer acceptance testing pad in parallel with the dicing line.

* * * * *